United States Patent
Popova

(10) Patent No.: US 10,178,492 B2
(45) Date of Patent: *Jan. 8, 2019

(54) APPARATUS, SYSTEMS AND METHODS FOR ADJUSTING OUTPUT AUDIO VOLUME BASED ON USER LOCATION

(71) Applicant: EchoStar Ukraine LLC, Kharkov (UA)

(72) Inventor: Albina Popova, Kharkov (UA)

(73) Assignee: ECHOSTAR UKRAINE LLC, Kharkov (UA)

( * ) Notice: Subject to any disclaimer, the term of this patent is extended or adjusted under 35 U.S.C. 154(b) by 0 days.

This patent is subject to a terminal disclaimer.

(21) Appl. No.: 15/249,880

(22) Filed: Aug. 29, 2016

(65) Prior Publication Data

US 2016/0366531 A1 Dec. 15, 2016

Related U.S. Application Data

(63) Continuation of application No. 14/375,400, filed as application No. PCT/UA2012/000008 on Jan. 30, 2012, now Pat. No. 9,431,980.

(51) Int. Cl.
*H03G 3/20* (2006.01)
*H04S 7/00* (2006.01)
*G06F 3/16* (2006.01)

(52) U.S. Cl.
CPC .............. *H04S 7/303* (2013.01); *G06F 3/165* (2013.01); *H03G 3/20* (2013.01); *H04R 2430/01* (2013.01); *H04S 2400/13* (2013.01)

(58) Field of Classification Search
CPC .. H03G 3/20; H03G 3/04; H03G 3/32; H03G 3/001; H03G 3/002; H04R 2430/01

USPC .......................................... 381/104–109, 103
See application file for complete search history.

(56) References Cited

U.S. PATENT DOCUMENTS

| | | | |
|---|---|---|---|
| 6,741,273 B1 | 5/2004 | Waters et al. | |
| 2005/0063556 A1 | 3/2005 | McEachen et al. | |
| 2007/0200858 A1 | 8/2007 | Yu | |
| 2007/0202858 A1* | 8/2007 | Yu .................. | H04M 1/605 455/414.1 |
| 2008/0069380 A1* | 3/2008 | Cheng .................. | H03G 3/3005 381/107 |
| 2008/0130958 A1 | 6/2008 | Ziomek | |
| 2011/0069841 A1* | 3/2011 | Angeloff .................. | H03G 3/30 381/17 |
| 2013/0028443 A1* | 1/2013 | Pance ..................... | G06F 3/167 381/107 |

(Continued)

FOREIGN PATENT DOCUMENTS

JP 2007251307 9/2007

*Primary Examiner* — Disler Paul
(74) *Attorney, Agent, or Firm* — Lowe Graham Jones PLLC; Raymond Armentrout

(57) ABSTRACT

Systems and methods are operable to adjust an output audio volume level of presented audio content that is output as sound from one or more speakers in a media presentation environment. An exemplary embodiment detects movement of a user who is listening to the audio content; increases the output audio volume level when the detected user movement is away from a predefined location in the media presentation environment; and decreases the output audio volume level when the detected user movement is closer to the predefined location in the media presentation environment.

18 Claims, 3 Drawing Sheets

(56) References Cited

U.S. PATENT DOCUMENTS

2013/0094666 A1    4/2013   Haff et al.
2013/0170647 A1*   7/2013   Reilly .................... H04R 27/00
                                                                                          381/17

* cited by examiner

APPARATUS, SYSTEMS AND METHODS FOR ADJUSTING OUTPUT AUDIO VOLUME BASED ON USER LOCATION

PRIORITY CLAIM

This patent application is a Continuation of U.S. Non-Provisional patent application Ser. No. 14/375,400, filed Jul. 29, 2014, published as U.S. Publication No. 2015/0010169, entitled "APPARATUS, SYSTEMS AND METHODS FOR ADJUSTING OUTPUT AUDIO VOLUME BASED ON USER LOCATION," issued as U.S. Pat. No. 9,431,980 on Aug. 30, 2016, which is a § 371 National Stage Application of International Application Serial No. PCT/UA2012/000008, filed Jan. 30, 2012, published as International Publication No. WO2013/115748, entitled "APPARATUS, SYSTEMS AND METHODS FOR ADJUSTING OUTPUT AUDIO VOLUME BASED ON USER LOCATION," the contents of which are herein incorporated by reference in their entirety. Accordingly, the present application claims the priority to and the benefit of International Application No. PCT/UA2012/000008.

BACKGROUND

Media devices, such as a set top box, a stereo, a television, a computer system, a game system, or the like, are often configured to provide adjustable control of the audio output of an audio track of presented media content. The user will, based on their location in a media presentation environment, adjust the output audio volume to a desired comfort level that is based upon their current distance from the source of the output audio and their personal preferences. The user typically adjusts the output audio volume to the desired comfort level using a remote control, a manual controller on the controlled media device, or the like.

The user may, from time to time, move about the media presentation environment. For example, the user may initially be sitting on their couch in a living room or the like. At some point, they may go to the restroom or the kitchen for a brief period of time. In situations where the user would like to still be able to hear the output audio, they have to manually adjust the output audio volume prior to moving. Or, they have to manually adjust the output audio volume after they arrive at the new location in the media presentation environment.

However, adjusting the output audio volume may be a distraction and/or an inconvenience. Further, adjusting the output audio volume may be difficult for some individuals, especially physically impaired users, such as those that may be in a wheel chair and/or that may be visually impaired.

Accordingly, there is a need in the arts to provide systems and methods that are more user friendly in adjusting the output audio volume or presented media content.

SUMMARY

Systems and methods of adjusting an output audio volume level of presented audio content that is output as sound from one or more speakers in a media presentation environment are disclosed. An exemplary embodiment detects movement of a user who is listening to the audio content; increases the output audio volume level when the detected user movement is away from a predefined location in the media presentation environment; and decreases the output audio volume level when the detected user movement is closer to the predefined location in the media presentation environment.

BRIEF DESCRIPTION OF THE DRAWINGS

Preferred and alternative embodiments are described in detail below with reference to the following drawings.

DETAILED DESCRIPTION

Figure 1:
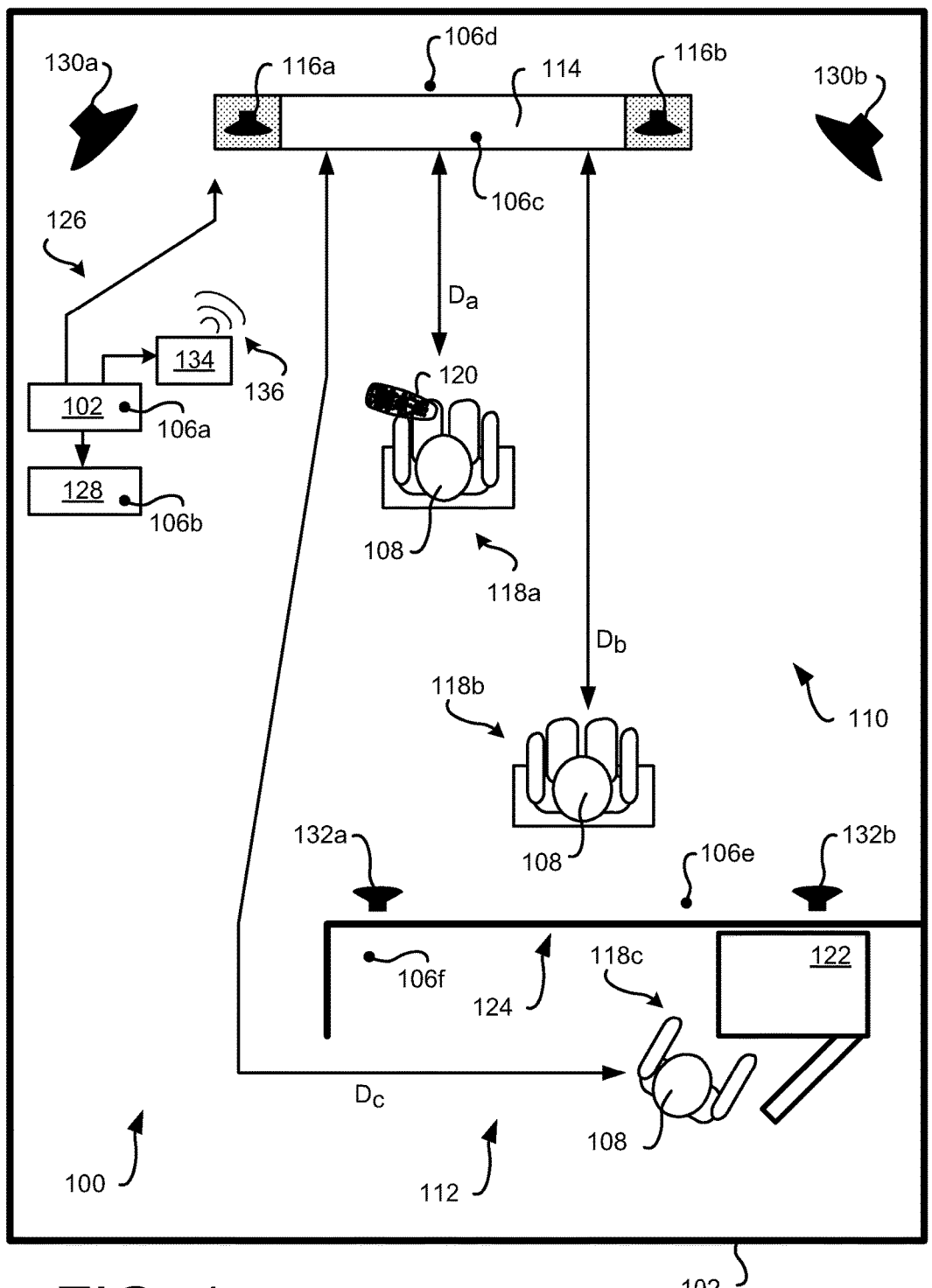
FIG. 1 is a block diagram of an automatic output audio volume adjuster implemented in an exemplary media device operating in a media presentation environment.

FIG. 1 is a block diagram of an embodiment of an automatic output audio volume adjuster 100 implemented in an exemplary media device 102 operating in a media presentation environment 104. Examples of media devices 102 may include, but are not limited to, a set top box (STB), a stereo, a surround-sound receiver, a radio, a television (TV), a digital video disc (DVD) player, a digital video recorder (DVR), a game playing device, or a personal computer (PC). Example media presentation environments 104 may include a media room in a home, a work space in an office, or the like.

Embodiments of the automatic output audio volume adjuster 100 are configured to automatically adjust the output audio volume level based upon a detected location of at least one user in the media presentation environment 104. Detected user locations are used to determine a distance of movement of the user. User location in the media presentation environment 104 is detected by at least one detector 106. In an exemplary embodiment, the detector 106a resides in the media device 102. Alternatively, the example detector 106a may be an external component that is communicatively coupled to the media device 102.

Based on the known location of the detector(s) 106, based upon the determined user location, and based upon a current output audio volume level, embodiments of the automatic output audio volume adjuster 100 are configured to automatically adjust the output audio volume level as the user 108 moves about the media presentation environment 104. The output audio volume level is automatically adjusted to maintain the relative audio volume that is heard by the user 108. For example, if the user 108 moves closer to the source of the output audio, typically a speaker or the like, then the automatic output audio volume adjuster 100 will reduce the output audio volume level in response to the user 108 moving closer to the source of the output audio. An amount of change in the output audio volume level is based on the determined distance of user movement towards the source of the audio output. On the other hand, if the user 108 moves farther from the source of the output audio, the automatic output audio volume adjuster 100 will increase the output audio volume level in response to the user 108 moving farther from the source of the output audio. An amount of change in the output audio volume level is based on the determined distance of user movement away from the source of the audio output.

The exemplary media presentation environment 104 of FIG. 1 comprises different rooms, such as a media room 110 and a kitchen 112. A visual presentation device, such as the example television (TV) 114, a right speaker 116a, and a left speaker 116b are illustrated in the media room 110. In some systems, the speakers 116a, 116b are integrated components of the TV 114. In an example embodiment, the media device 102 communicates a stream of media content to the TV 114, wherein the streaming media comprises a stream of video content and a stream of audio content. The stream of audio content is reproduced as sounds associated with the output audio volume level by the speakers 116a, 116b.

The user 108, when at example location 118a, may use a remote control 120 or another controller to adjust the output audio volume of the speakers 116a, 116b so that the user 108 hears sound at a desired output volume level (magnitude of sound level) while at the location 118a. The magnitude of the output audio volume level of the sound heard by the user may be measured and/or expressed in decibels or the like. Here, the user 108 is illustrated as sitting in a seat that is a distance $D_a$ from the TV 114. The decibel level of the sound heard by the user 108 is appreciated to be a function of the distance $D_a$ from the TV 114 and a function of the listening preferences of the user 108.

In the event that the user 108 moves to a different location, such as at the seat shown at the location 118b (that is a distance $D_b$ from the TV 114), embodiments of the automatic output audio volume adjuster 100 will adjust (increase) the output audio volume of the speakers 116a, 116b such that the decibel level of the sound heard by the user 108 is the same, or substantially the same, as heard by the user 108 while at the location 118a. The relationship between the distance $D_a$ from the TV 114 (and thus the decibel level of the sound heard by the user 108 when at the location 118a) and the distance $D_b$ from the TV 114 (and thus the decibel level of the sound heard by the user 108 when at the location 118b) may be computationally described using an equation-based relationship, based on specified data, or the like.

As another example, the user 108 may go into the kitchen 112, generally indicated by the location 118c, to access a beverage and/or snack from the refrigerator 122. The decibel level of the sound heard by the user 108 is appreciated to be, in part, a function of the distance $D_c$ from the TV 114. However, the relationship between the distance $D_c$ from the TV 114 and the decibel level of the sound heard by the user 108 may not be sufficient alone to define an equation-based relationship between the distance from the audio source and the output audio volume level because of the turns and the intervening wall 124. Accordingly, control of the output audio volume level may be based on specified and/or predefined information that has been stored in a memory medium or the like. For example, the output audio volume level of the sound may be adjusted to a predefined value when the detector 106f detects presence of the user 108.

Control of the output audio volume of the speakers 116a, 116b may be controlled in a variety of manners by various embodiments of the automatic output audio volume adjuster 100. For example, a wire connector 126 may be communicatively coupled to the TV 114 and/or the speakers 116a, 116b to provide the streaming audio content from the media device 102. In this operating configuration, the automatic output audio volume adjuster 100 may raise or lower the output audio volume level provided to the TV 114 and/or the speakers 116a, 116b.

Alternatively, or additionally, a surround sound receiver 128 may be communicatively coupled to the media device 102 to provide surround sound type audio content using a plurality of other speakers. For example, but not limited to, speakers 130a, 130b may be located in proximity to the TV 114 and in front of the viewing area of the media presentation environment 104 to provide the front channel audio output of the surround sound type audio content. Speakers 132a, 132b may be located to the rear of the media presentation environment 104 to provide the rear channel audio outputs. Other speakers (not shown) may be used to present other audio channel outputs of the surround sound type audio content. In this operating configuration, the automatic output audio volume adjuster 100 may raise or lower the output audio volume level of the speakers 130a, 130b, and concurrently lower or raise the output audio volume level of the speakers 132a, 132b, respectively, as the user 108 moves about the media presentation environment 104. That is, if the user 108 moves from the example location 118a to the example location 118b, output from the speakers 130a, 130b is increased and the output from speakers 132a, 132b is concurrently decreased so that the decibel level of audio volume that is heard by the user 108 remains substantially constant. The amount of change in the output audio volume level is based on the determined distance of user movement as the user 108 moves about the media presentation environment 104.

Alternatively, or additionally, an infrared (IR) blaster type device 134 or the like may be communicatively coupled to the media device 102 (or the surround stereo receiver 128). The IR blaster 134 is configured to communicate commands in an IR signal 136 to the TV 114 (or to another device) to control the output audio volume level. In some embodiments, the IR blaster 134 is internal to the media device 102. In other embodiments, the IR blaster 134 is a separate device that may be optionally communicatively coupled to the media device 102.

In some embodiments, the detectors 106 used to detect the user 108 for determination of the user location may reside in other devices. For example, but not limited to, the detector 106b resides in the example surround sound receiver 128. Alternatively, the detector 106c resides in the TV 114.

In some embodiments, the detectors 106 may be stand-alone detector devices that are located in the media presentation environment 104. For example, the example detector 106d is illustrated as residing in proximity to the TV 114. As another example, the example detector 106e resides in the rear of the media room 110. As yet another example, the example detector 116f resides in the kitchen 112.

Further, in some embodiments, a plurality of detectors 106 may cooperatively provide information to determine user location. For example, but not limited to, an embodiment may use information from the detector 106a in the media device 102, from the detector 106d in proximity to the TV 114, and from the detector 106e at the rear of the media room 110, to more precisely determine the user location. Alternatively, or additionally, such as when the user moves into the kitchen 112 and is therefore no longer detectable by the detectors 106a-106e, the detector 106f may provide information to determine that the user 108 is currently in the kitchen 112 (and optionally, where in the kitchen the user 108 is located). In other operating environments, detectors may be located in any location of interest within the media presentation environment 104 so as to provide control of the output audio volume levels when the user 108 is currently in proximity to that particular detector.

In the various embodiments, the movement of the user may comprise a forward/backwards component and a lateral (side-to-side) component. For lateral movements of the user, some embodiments may not adjust the output audio volume level because the user has not moved closer to or farther away from the source of the output audio. When the movement of the user has both a lateral component and a forward/backwards, embodiments determine the forward/backwards component of user movement based on the determined distance of user movement. The amount of volume adjustment is then based on the determined forward/backwards component of the user's distance of movement. For example, the output audio volume level of the at least one left channel speaker is increased and the output audio volume level of the at least one right channel speaker is decreased when the determined lateral component of distance of the user movement is to the left. Conversely, the output audio volume level of at least one left channel speaker is increased and the output audio volume level of at least one right channel speaker is decreased when the determined lateral component of distance of the user movement is to the right. Changes made to the front left and right speakers 116a, 116b and the rear right and left speakers 132a, 132b may be the same or may be different depending upon the characteristics of the media presentation environment 104, user preferences, and/or features of the automatic output audio volume adjuster 100 embodiment.

Figure 2:
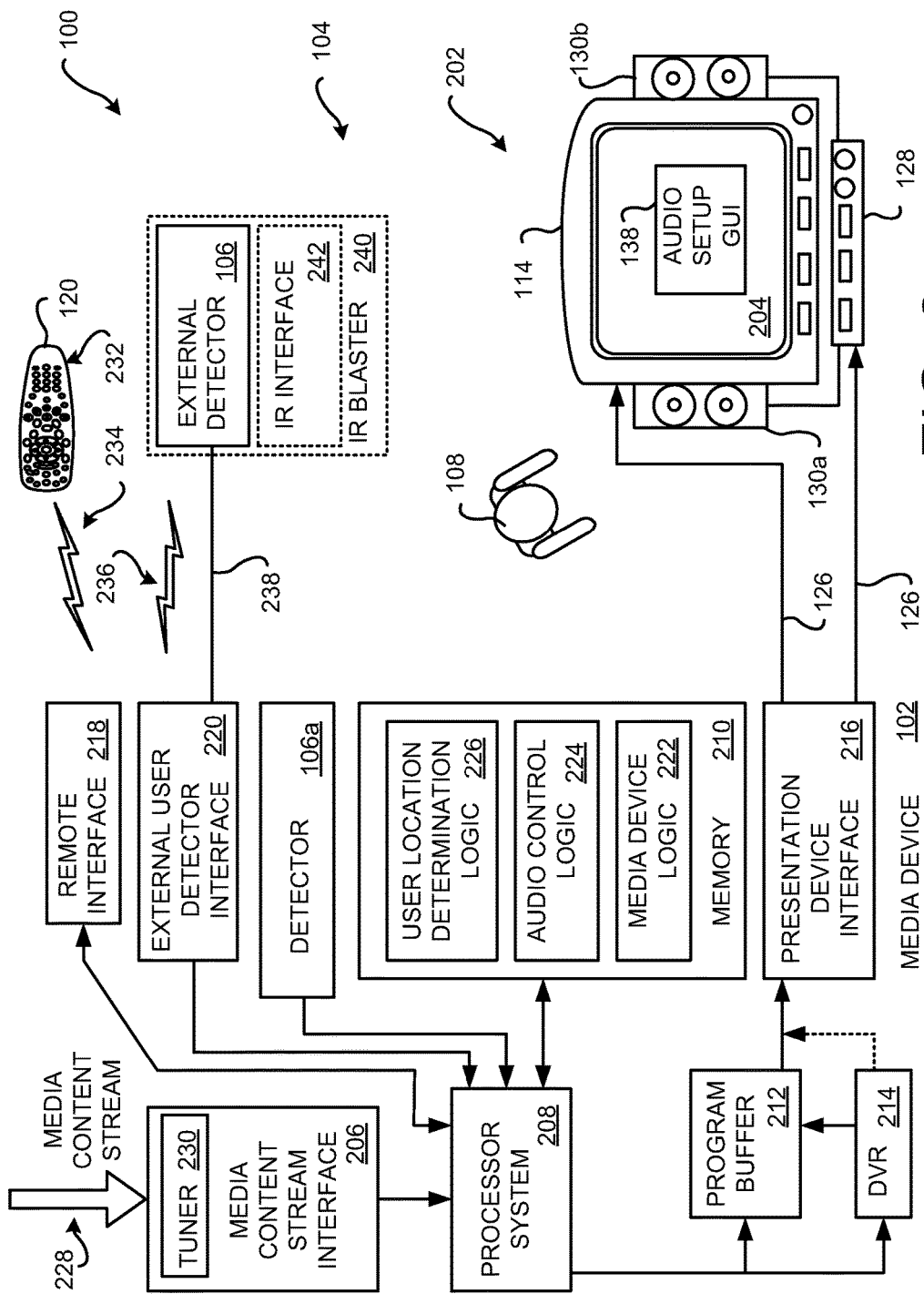
FIG. 2 is a block diagram of an embodiment of the automatic output audio volume adjuster implemented in an exemplary media device.

FIG. 2 is a block diagram of an embodiment of the automatic output audio volume adjuster 100 implemented in an exemplary media device 102, shown as a set top box (STB). Embodiments of the media presentation environment 104 may be implemented in other media devices, such as, but not limited to, stereos, surround-sound receivers 128, radios, televisions (TVs) 114, digital video disc (DVD) players, digital video recorders (DVRs), game playing devices, or personal computers (PCs) that are configured to present a video-based media content event that is presented to the user 108 in a media presentation environment 104.

The exemplary media device 102 is communicatively coupled to a media presentation system 202 that includes a visual display device, such as a television (hereafter, generically a TV 114), and an audio presentation device, such as the exemplary surround sound receiver 128. Other types of media content output devices may also be coupled to the media device 102, including those providing any sort of stimuli sensible by a human being, such as temperature, vibration and the like. The video portion of the media content event is displayed on the display 204 of the TV 114. The audio portion of the media content event is reproduced as sounds by the exemplary speakers 130a, 130b. In some embodiments, the media device 102 and the media presentation system 202 and one or more components of the media presentation system 202 may be integrated into a single electronic device.

The non-limiting exemplary media device 102 comprises a media content stream interface 206, a processor system 208, a memory 210, a program buffer 212, an optional digital video recorder (DVR) 214, a presentation device interface 216, a remote interface 218, an optional detector 106a, and an optional external detector interface 220. The memory 210 comprises portions for storing the media device logic 222, the audio control logic 224, and the user location determination logic 226. In some embodiments, the media device logic 222, the audio control logic 224, and/or the user location determination logic 226 may be integrated together, and/or may be integrated with other logic. In other embodiments, some or all of these memory and other data manipulation functions may be provided by using a remote server or other electronic devices suitably connected via the Internet or otherwise to a client device. Other media devices 102 may include some, or may omit some, of the above-described media processing components. Further, additional components not described herein may be included in alternative embodiments.

The functionality of the media device 102, here a set top box, is now broadly described. A media content provider provides media content that is received in one or more multiple media content streams 228 multiplexed together in one or more transport channels. The transport channels with the media content streams 228 are communicated to the media device 102 from a media system sourced from a remote head end facility (not shown) operated by the media content provider. Non-limiting examples of such media systems include satellite systems, cable system, and the Internet. For example, if the media content provider provides programming via a satellite-based communication system, the media device 102 is configured to receive one or more broadcasted satellite signals detected by an antenna (not shown). Alternatively, or additionally, the media content stream 228 can be received from one or more different sources, such as, but not limited to, a cable system, a radio frequency (RF) communication system, or the Internet.

The one or more media content streams 228 are received by the media content stream interface 206. One or more tuners 230 in the media content stream interface 206 selectively tune to one of the media content streams 228 in accordance with instructions received from the processor system 208. The processor system 208, executing the media device logic 222 and based upon a request for a media content event of interest specified by the user 108, parses out media content associated with the media content event of interest. The media content event of interest is then assembled into a stream of video and/or audio information which may be stored by the program buffer 212 such that the media content can be streamed out to components of the media presentation system 202, such as the TV 114 and/or the speakers 130a, 130b, via the presentation device interface 218. Alternatively, or additionally, the parsed out media content may be saved into the DVR 214 for later presentation. The DVR 214 may be directly provided in, locally connected to, or remotely connected to, the media device 102.

The exemplary media device 102 is configured to receive commands from the user 108 via a remote control 120. The remote control 120 includes one or more controllers 232. The user 108, by actuating one or more of the controllers 232, causes the remote control 120 to generate and transmit commands, via a wireless signal 234, to the media device 102. The commands control the media device 102 and/or control the components of the media presentation system 202. The wireless signal 234 may be an infrared (IR) signal or a radio frequency (RF) signal that is detectable by the remote interface 218.

Some embodiments are configured to receive information from an external detector 106 (generally corresponding to one or more of the above-described detectors 106b-106o. The external detector interface 220 may be configured to receive a wireless signal 236 emitted by the external detector 106. The wireless signal 236 may be an RF signal and/or an IR signal. Some embodiments of the external detector interface 220 may be configured to receive a plurality of wireless signals 236 emitted by different external detectors 106. Alternatively, or additionally, the external detector interface 220 may be configured to communicatively couple the external detector 106 via a wire-based connector 238. If multiple external detectors 106 are employed, the external detector interface 220 may be configured to receive multiple connectors 238.

Any suitable detector device may be used for the detector 106a and/or the external detector(s) 106 which provide information used to determine the location of one or more users 108. In an exemplary embodiment, an infrared type detector may be used. Alternatively, or additionally, an image capture type detector (e.g., a camera) may be used. Ultrasonic, microwave and/or tomographic type sensors may be used.

The processes performed by the media device 102 relating to the processing of the received media content stream 228 and communication of a presentable media content event to the components of the media presentation system 202 are generally implemented by the processor system 208 while executing the media device logic 222. Thus, the media device 102 may perform a variety of functions related to the processing and presentation of one or more media content events received in the media content stream 228.

The processes performed by the media device 102 relating to adjusting the output audio volume are generally implemented by the processor system 208 while executing the audio control logic 224. In some embodiments, the media device 102 may control the output audio volume level directly by controlling one or more audio amplifiers (not shown) that are driving the speakers.

In some embodiments, the media device 102 may control volume indirectly by generating and communicating volume output control commands to audio devices that are controlling the output audio volume of the speakers, such as the example surround sound receiver 128. For example, but not limited to, the media device 102 may generate and communicate an output audio volume level increase command and/or signal in response to the user 108 moving farther away from the TV 114. On the other hand, the media device 102 may generate and communicate an output audio volume level decrease command and/or signal in response to the user 108 moving closer to the TV 114.

The processes performed by the media device 102 relating to the processing of the received information from one or more of the detectors 106, and the associated determination of the location of the user 108 and the determined distance of user movement, are generally implemented by the processor system 208 while executing the user location determination logic 226. Thus, the media device 102 may perform a variety of functions related to the receiving and processing detector information received at the media content stream 228, and the attendant computations associated with determining the location of the user 108. Preferably, the processing of received detector information and determination of the location of the user 108 occurs on a real time basis, or near real time basis, so that the output audio volume is adjusted as the user 108 is moving about the media presentation environment 104. When the output audio volume is adjusted on a real time basis, or near real time basis, the user 108 will hear the audio output at a constant, or substantially constant, output audio volume level (decibel level) as they are moving about the media presentation environment 104.

The user location may be determined based on information provided by one or more detectors 106 using any suitable algorithm. In an example embodiment, once an initial user location is determined (and after the user 108 has adjusted the output audio volume level to a desired level), a corresponding current output audio volume level is stored. As the user 108 moves about the media presentation environment 104, changes in the user location are determined. Changes in the determined distance of user movement are determined therefrom.

In some embodiments, relative changes in user location are used to determine a change in the distance between the user 108 and the TV 114 or another reference location. For example, if the automatic output audio volume adjuster 100 determines that the user 108 has moved farther away from the TV 114 by a distance of ten feet, the output audio volume is increased. The magnitude of the increase in the output audio volume corresponds to the determined ten feet change in location of the user 108.

Alternatively, or additionally, actual changes in user location in the media presentation environment 104 are used to determine the distance change between the user 108 and the TV 114 or another reference location. For example, if the automatic output audio volume adjuster 100 determines that the user 108 has moved from the location 118a to the location 118b, then the automatic output audio volume adjuster 100 determines the distance change based on the actual locations 118a, 118b. Accordingly, the output audio volume is increased. The magnitude of the increase in the output audio volume corresponds to the determined change in distance between the locations 118a and 118b.

In an example embodiment, the output audio volume level may be specified (predefined) for a plurality of different locations in the media presentation environment 104. For example, the output audio volume level for locations 118a, 118b and 118c may be predefined and stored in a memory medium, such as, but not limited to, a portion of the memory 210. For example, a table or other suitable relational database may be used to store a plurality of predefined output audio volume levels and associated location information, and/or associated distance of movement information.

When the user 108 is currently detected as being at location 118a, and/or at least near to location 118a (proximate to), in the media presentation environment 104, the automatic output audio volume adjuster 100 adjusts the output audio volume level to the predefined level associated with location 118a. When the user 108 is detected as being at location 108b, and/or at least near to location 118b (proximate to), then the output audio volume level is adjusted to the predefined level associated with location 118b.

At times, the user 108 may not be at a particular location in the media presentation environment 104 that is associated with a predefined output audio volume level. Embodiments may be additionally configured to identify one or more nearby locations in the media presentation environment 104 that have associated output audio volume levels, and then an output audio volume level for the current location may be determined therefrom. An example embodiment adjusts the output audio volume level based on the location having the predefined output audio volume level that is closest to the user's determined current location.

In another example embodiment, interpolation between the current location of the user 108 and two nearby locations that have associated output audio volume levels may be used. For example, if the current location of the user 108 is midway between the locations 118a and 118b, then the adjustment to the output audio volume level may be determined using interpolation to be midway between the output audio volume level associated with the location 118a and the output audio volume level associated with the location 118b. For example, a distance ratio is determined based on interpolation between a first known location, a second known location and the determined new location of the user. Then, a new output audio volume level is determined based upon the determined distance ratio, and based on interpolating between a first output audio volume level associated with the first distance and a second output audio volume level associated with the second distance. The output audio volume level may then be increased or decreased based on the new output audio volume level.

Some embodiments of the automatic output audio volume adjuster 100 determine real time adjustments based on a real time location of the user 108, and/or based on real time determined distance of user movement, as the user 108 moves about the media presentation environment 104. Real time adjustments of the output audio volume level may be determined in a variety of manners based on the current location of the user 108, and/or based on the current distance of movement of the user 108, that is determined on a real time, or near real time, basis. For example, but not limited to, interpolation may be used to determine the adjustment of the output audio volume level based upon a real time, or near real time, determination of user location based on at least two known locations and their associated output audio volume levels.

In some embodiments, the predefined output audio volume levels associated with particular locations in the media presentation environment 104 are expressed as a normalized value, such as a percentage basis, per unit basis, or the like. Depending upon the nature of the media content being listened to by the user 108, the user 108 may set the output audio volume level at a particular desired value. For example, the user 108 may have the current level set relatively low when listening to music while reading a book. On the other hand, the user 108 may have the current output audio volume level set relatively high when watching a movie. Accordingly, the adjustment of the output audio volume level may be determined based on the current output audio volume level that has been set by the user 108. Here, the new output audio volume level may be determined by computing the relationship between the actual current output audio volume level and the normalized output audio volume level at the current location of the user 108. When the user 108 moves to a new location, the new output audio volume level can be determined based upon the previously determined relationship and the normalized output audio volume level of the new location, and/or based on the determined distance of user movement.

For example, the user 108 when at location 118*a* may set the output audio volume level to a 25% level. The normalized output audio volume level may be 50% (or some similar normalized value). The relationship between the current and normalized output audio volume levels is one half (25%/50%=0.5). If the normalized output audio volume level associated with location 118*b* is a 75% level, when the user 108 moves to the location 118*b*, the adjustment may be determined to be 37.5%, which is one half of the 75% normalized output audio volume level.

A calibration process may be used to customize operation of the automatic output audio volume adjuster 100 to a particular media presentation environment 104 when the adjustments of the output audio volume level are determined from a plurality of specified (predefined) output audio volume levels associated with different locations in media presentation environment 104. During a calibration process, the user 108 goes to a location of interest in the media presentation environment 104. The location that the user 108 is currently at may be input by the user 108 in some embodiments. Alternatively, or additionally, the detector(s) 106 may determine the current location of the user 108.

While at that current location in the media presentation environment 104 during the calibration process, the user 108 sets (specifies) a desired output audio volume level. For example, the user 108 may be listening to a calibration tone output from the speakers 116*a*, 116*b*. The user 108 may then adjust the heard level of the tone to a desired level by increasing or decreasing the output audio volume level. Alternatively, or additionally, the user 108 may listen to the audio output of a presented media content event, and may then adjust the output audio volume level so that the audio heard by the user 108 is at a desired level. The user 108, in an example embodiment, sets the output audio volume level using their remote control 120 or another suitable controller.

Then, the currently set (specified) output audio volume level may be associated with the determined current location in the media presentation environment 104. The set (specified) output audio volume level and the associated location information is then saved.

Next, the calibration process is repeated for one or more other locations of interest in the media presentation environment 104. Once the calibration process has been completed for that particular media presentation environment 104, operation of the automatic output audio volume adjuster 100 may then be initiated.

In some embodiments, the external detector 106 may be a component of an infrared (IR) blaster 240 that includes an interface 242 that is configured to output an IR signal that has information that controls the output audio volume level of the sound output from the at least one speaker. The IR signal may be detectable at the media device 102 and/or may be detectable at more of the devices of the media presentation system 202.

Figure 3:
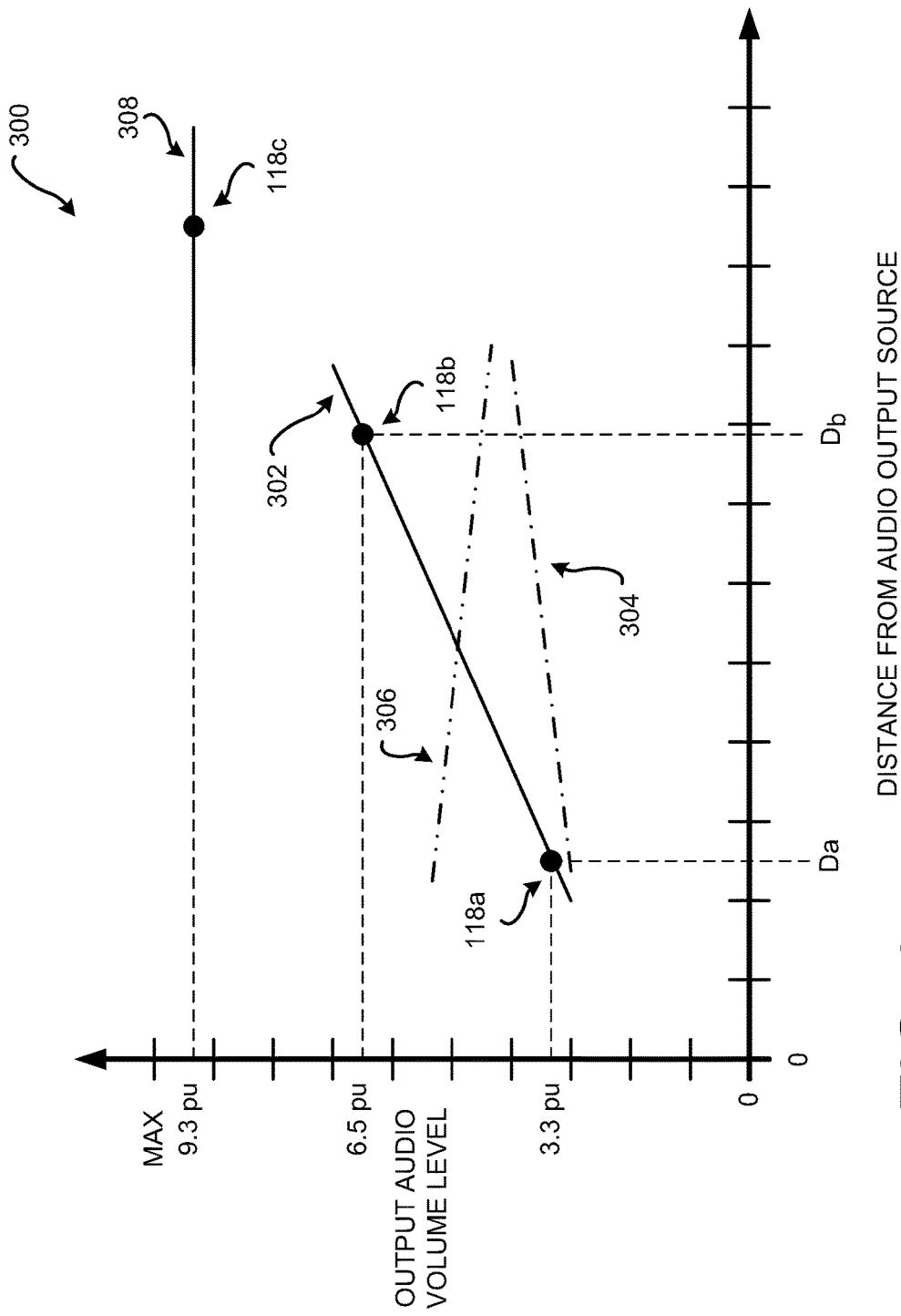
FIG. 3 is a graph illustrating relationship between output audio volume level and distance from the audio output source.

FIG. 3 is a graph 300 illustrating relationship between output audio volume level and distance from the audio output source (or another reference location). The output audio volume level axis is expressed using a per unit (pu) basis. Embodiments may use any suitable metric for the output audio volume level. Any suitable measure of distance, such as feet, meters, relative distance, per unit, or the like, may be used to express distance along the distance from the audio output source axis. Further, some embodiments may be based on the distance from a suitable reference point.

As illustrated in FIG. 3, some embodiments may make adjustments in the output audio volume level based on a predefined output audio volume level function, F(oavl), as shown below by equation (x).

$$(L_{new}) = F(\text{oavl}) * (L_{current}) \tag{1}$$

Such embodiments of the automatic output audio volume adjuster 100 determine the new output audio volume level ($L_{new}$) based on the current output audio volume level ($L_{current}$) (in effect prior to movement of the user 108) in accordance with the predefined output audio volume level function.

In the various embodiments, the adjustment of the output audio volume level may be based on the current output audio volume level ($L_{current}$) that has been set by the user 108. Depending upon the nature of the media content being currently listened to by the user 108, and their current preferences, the current output audio volume level may be set by the user 108 at a particular level of interest. For example, the user 108 may have the current level set relatively low when listening to music while reading a book. On the other hand, the user 108 may have the current output audio volume level set relatively high when watching a movie. Accordingly, the new output audio volume level ($L_{new}$) can be based on the current audio level preferences of the user 108 and a change in location of the user 108 in the media presentation environment 104.

The curve 302 illustrates a simplified hypothetical linear relationship between the output audio volume level and distance from the source of the output audio or another reference location. For example, at the distance Da (corresponding to the location 118a in FIG. 1), the output audio volume level is approximately 3.3 per unit (pu). At the distance Db (corresponding to the location 118b in FIG. 1), the output audio volume level is approximately 6.5 per unit. Since the interception of the curve 302 with the output audio volume level axis is determinable, and two data points on the curve 302 are known, the output audio volume level function, F(oavl), may be defined as a linear equation. Once a value of the output audio volume level function, F(oavl), is determined, then an adjustment to the current output audio volume level ($L_{current}$) may be determined.

Some embodiments may be configured to have multiple output audio volume level functions. For example, the curve 304 is a different output audio volume level function, F(oavl). The curve 304 has a smaller slope as compared to the curve 302. Accordingly, as the user 108 moves from the distance Da towards the distance Db, the magnitude of the output audio volume level adjustment will be less (than compared to when the output audio volume level adjustment is based on the curve 302).

In embodiments that have multiple output audio volume level functions, a determination is made to select which particular output audio volume level function is to be used to adjust the output audio volume level based on the current detected location of the user 108. In some embodiments, the determination may be based on user identity, where each user is associated with at least one output audio volume level function. The user 108 may specify their identity so that their associated output audio volume level function is used to adjust the output audio volume level. Alternatively, or additionally, the user 108 may be identified in other manners, such as by voice recognition or facial recognition.

Alternatively, or additionally, a single user 108 may be associated with multiple output audio volume level functions, wherein each output audio volume level function is associated with a type of media content. For example, the adjustments made to the output audio volume level for an action movie may be different from adjustments made for a drama or musical. Accordingly, a first output audio volume level function such as defined by the curve 302 may be used for a first type of adjustment (associated with a first type of media content) and a second output audio volume level function such as defined by the curve 304 may be used for a second type of adjustment (associated with a second type of media content).

In some embodiments, a plurality of different output audio volume level functions may be used to control different speakers. For example, the output audio volume level function associated with curve 302 may be used to increase the output audio volume level from the front left and right channel speakers 130a, 130b as the user 108 moves farther away from the TV 114 (FIG. 1). When the audio channel is provided by the surround sound receiver 128, the output audio volume level of the back right and back left (rear channel) speakers 132a, 132b should be decreased as the user 108 moves farther away from the TV 114 (and thus moves closer to the speakers 132a, 132b). Accordingly, the example curve 306 may be used as the output audio volume level function that controls the adjustment of the output audio volume level from the speakers 132a, 132b.

Additionally, or alternatively, an output audio volume level function may be used to individually (separately) control the right channel and left channel output audio volume levels as a function of the relative lateral location of the user 108 in the media presentation environment 104. For example, as the user 108 moves towards the right hand side of the media presentation environment 104, an output audio volume level function may be used to increase the output audio volume level from the example speaker 116a and to decrease the output audio volume level from the example speaker 116b. In such embodiments, multiple output audio volume level functions may be used in cooperation with each other to concurrently adjust for forward/backward and left/right movements of the user 108.

The example curves 302, 304, and 306 are illustrated as linear-type output audio volume level functions. Embodiments may employ curvilinear-type output audio volume level functions where the adjustments to the output audio volume level are not linear. The curvilinear output audio volume level function may be represented as a curvilinear line. Alternatively, the curvilinear output audio volume level function may be represented as a curvilinear surface that adjusts the output audio volume level for forward/backward and left/right movements of the user 108.

In some embodiments, the output audio volume level function may be disjoint at some distances from the source of the output audio or another reference location. For example, when the user 108 goes into the kitchen 112 and is at the location 118c (FIG. 1), the relationship between the output audio volume level and distance may not be meaningful. Is such situations, the output audio volume level function may be defined to adjust the output audio volume level to a predefined level. For example, but not limited to, when the user 108 is in the kitchen 112, the output audio volume level may be set at 9.3 per unit (which is near the maximum output audio volume level). The determination may be made that the user 108 is in the kitchen 112 when the detector 106f detects the user 108 and/or when the other detectors 106 no longer detect the user 108. In some embodiments, the disjoint may be represented as a suitable linear-type or curvilinear-type output audio volume level function, such as the non-limiting example curve 308.

Some embodiments may use relative changes in location as the user 108 moves about the media presentation environment 104 in accordance with equation (1) above. For example, the current output audio volume level may be at a level "X" when the current location of the user 108 is known. If the user 108 is detected as moving backwards by some distance "Y", then embodiments of the automatic output audio volume adjuster 100 will cause the adjustment of the output audio volume level to increase by some incremental amount. The incremental amount of adjustment in the output audio volume level may then be determinable based on the predefined output audio volume level function F(oavl).

When the output audio volume level adjustment is determined based on some predefined function, such embodiments do not need to determine or have a prior knowledge of the user's current location prior to their moving about the media presentation environment 104. Rather, the magnitude of the change in location of the user 108 need only be sensed and/or determined for adjustment of the output audio volume level in accordance with the output audio volume level function F(oavl).

During some operating scenarios, there may be different users 108 that may be listening to audio content from time to time. Some embodiments are configured to permit different users to individually calibrate the automatic output audio volume adjuster 100 to their preferences. Thus, when a particular user 108 is listening to audio media in the media presentation environment 104, the automatic output audio volume adjuster 100 may be actuated for that particular user 108. For example, the user 108 may input their name or other suitable user identifier to the automatic output audio volume adjuster 100. Alternatively, or additionally, a particular one of the controller(s) on the remote control 120 may be actuated to indicate to the automatic output audio volume adjuster 100 which particular user 108 the output audio volume level adjustments are to be made for. Alternatively, or additionally, embodiments that employ an image capture device may use a facial recognition algorithm to identify the user 108. Alternatively, or additionally, embodiments that employ microphone or the like may use a voice recognition algorithm to identify the user 108.

During other operating scenarios, there may be different users 108 that may be concurrently listening to audio content. Some embodiments are configured to permit deactivation (or selective activation) of the automatic output audio volume adjuster 100. Thus, when a particular user 108 moves about the audio media in the media presentation environment 104, the automatic output audio volume adjuster 100 is not adjusted, or is adjusted in accordance with a multiple user output audio volume level function, to mitigate or minimize changes in the output audio volume level that is heard by the other users 108 located in the media presentation environment 104. The selection to activate and/or to deactivate the automatic output audio volume adjuster 100 may be effected using the remote control 120 or another suitable controller.

Some embodiments may be configured to discern when there is a single user 108 or when there are a plurality of users 108 in the media presentation environment 104. When a single user 108 is present, the automatic output audio volume adjuster 100 may become automatically operational. Alternatively, or additionally, when a single user 108 is present, the single user 108 may be prompted for selective actuation of the automatic output audio volume adjuster 100. For example, a prompt, menu, or the like may be presented on the TV 114 such that, in response to a user input, the automatic output audio volume adjuster 100 becomes activated (or deactivated). In some embodiments, the automatic output audio volume adjuster 100 automatically deactivates when multiple users 108 are detected.

Some embodiments may be configured to discern a user 108 from other creatures, such as a pet. For example, a large dog may be present. Embodiments may be configured to discern that the moving object is the dog (and not a user 108), and accordingly, would not adjust the output audio volume level based on the detected movement.

Some embodiments employ the IR blaster 134 to communicate commands in an IR signal 136 to the TV 114, the media device 102, or to another device, to control the output audio volume level. In some embodiments, the IR blaster 134 is configured as the automatic output audio volume adjuster 100. The IR blaster 134 comprises a processor system 208, the memory 210 with the media device logic 222, the audio control logic 224, and the user location determination logic 226. The detector may be an internal part, and/or may be an external device communicatively coupled to the IR blaster 134. Initial setting information for the current output volume level may be detected by IR signals from the remote control 120 (when the IR blaster 134 includes a remote interface 218). In some embodiments, the IR blaster 134 output volume level increment and output volume level decrement commands as changes in the user location are detected.

It should be emphasized that the above-described embodiments of the automatic output audio volume adjuster 100 are merely possible examples of implementations of the invention. Many variations and modifications may be made to the above-described embodiments. All such modifications and variations are intended to be included herein within the scope of this disclosure and protected by the following claims.

The invention claimed is:

1. A method for adjusting output audio volume level of presented audio content that is output as sound from at least one speaker in a media presentation environment, the method comprising:
    calibrating an automatic output audio volume adjuster, the calibrating comprising:
        identifying a first location of a user in the media presentation environment;
        associating a first output audio volume level of the sound output from the at least one speaker with the first location;
        identifying a second location of the user in the media presentation environment;
        associating a second output audio volume level of the sound output from the at least one speaker with the second location;
        storing information defining the first location and the associated first output audio volume level;
        storing information defining the second location and the associated second output audio volume level;
        defining an output audio volume level function based on the first output audio volume level and the associated first location, and based on the second output audio volume level and the associated second location; and
        storing information defining the output audio volume level function,
    after calibration of the automatic output audio volume adjuster, the method further comprising:
        detecting a current location of the user listening to presented audio content;
        adjusting the output audio volume level to the first output audio volume level when the user is proximate to the first location;
        adjusting the output audio volume level to the second output audio volume level when the user is proximate to the second location;
        determining a third output audio volume level based on the current location of the user listening to presented audio content and based on the output audio volume level function; and
        adjusting the output audio volume level to the third output audio volume level when the user is at the current location.

2. The method of claim 1, wherein the at least one speaker is at least one front speaker, and wherein another speaker is a rear speaker, and further comprising:
    adjusting the output audio volume level of the at least one front speaker to the first output audio volume level when the current location of the user is proximate to the first location; and
    adjusting the output audio volume level of the rear speaker to a third output audio volume level when the current location of the user is proximate to the first location.

3. The method of claim 1, wherein calibrating the automatic output audio volume adjuster further comprises:
    receiving a first user specification of a first desired output audio volume level, wherein the first user specification corresponds to a first volume level heard by the user when the user is at the first location, and wherein the first output audio volume level is defined based on the first user specification; and receiving a second user specification of a second desired output audio volume level, wherein the second user specification corresponds to a second volume level heard by the user when the user is at the second location, and wherein the second output audio volume level is defined based on the second user specification.

4. The method of claim 3, further comprising:

associating the first user specification and the second user specification with a first type of media content, wherein the first output audio volume level and the second output audio volume level are used to adjust the output audio volume level of the presented audio content when a currently presented media content event corresponds to the first type of media content;

associating a fourth output audio volume level of the sound output from the at least one speaker with the first location, wherein the fourth output audio volume level is different from the first output audio volume level;

associating a fifth output audio volume level of the sound output from the at least one speaker with the second location, wherein the fifth output audio volume level is different from the second output audio volume level;

associating the fourth output audio volume level and the fifth output audio volume level with a second type of media content;

storing information defining the first location, the associated fourth output audio volume level and the associated second type of media content;

storing information defining the second location, the associated fifth output audio volume level and the associated second type of media content, wherein the fourth output audio volume level and the fifth output audio volume level are used to adjust the output audio volume level of the presented audio content when the currently presented media content event corresponds to the second type of media content.

5. The method of claim 1, wherein the first location and the second location are locations in a media room where the at least one speaker resides, wherein a third location in a different room is defined, the method further comprising:

associating a predefined fourth output audio volume level of the sound output from the at least one speaker with the third location;

storing information defining the third location and the associated fourth output audio volume level, wherein the fourth output audio volume level is not based on the output audio volume level function;

adjusting the output audio volume level to the fourth output audio volume level when the current location of the user listening to presented audio content is proximate to the third location.

6. The method of claim 1, wherein the output audio volume level function is defined based on a ratio between the first output audio volume level and the second output audio volume level and based on a function of distance from a reference location in the media presentation environment, and wherein the third output audio volume level ($L_{new}$) that is determined based on the current location ($L_{current}$) of the user listening to presented audio content and based on the output audio volume level function [F(oavl)] is determined based on the function $(L_{new})=F(oavl)*(L_{current})$.

7. The method of claim 6, wherein the output audio volume level function is a first output audio volume level function that is associated with a first type of media content, wherein the output audio volume level function is a second output audio volume level function that is associated with a second type of media content that is different from the first type of media content, wherein the first output audio volume level function produces a louder volume than the second output audio volume level function at the current location of the user listening to presented audio content, wherein the first output audio volume level function is used to adjust the output audio volume level of the presented audio content when the currently presented media content event corresponds to the first type of media content, and wherein the second output audio volume level function is used to adjust the output audio volume level of the presented audio content when the currently presented media content event corresponds to the second type of media content.

8. The method of claim 6, wherein the output audio volume level function is a first output audio volume level function that is associated with a first user preference, wherein the output audio volume level function is a second output audio volume level function that is associated with a second type of user preference that is different from the first user preference, wherein the first output audio volume level function produces a louder volume than the second output audio volume level function at the current location of the user listening to presented audio content, wherein after calibration of the automatic output audio volume adjuster, the method further comprises:

receiving one of the first user preference or the second user preference from the user listening to presented audio content, wherein the first output audio volume level is used to adjust the output audio volume level of the presented audio content when the currently presented media content event corresponds to the first type of user preference, and wherein the second output audio volume level is used to adjust the output audio volume level of the presented audio content when the currently presented media content event corresponds to the second type of user preference.

9. The method of claim 1, wherein after calibration of the automatic output audio volume adjuster, the method further comprising:

detecting presence of at least one other user in the media presentation environment; and deactivating operation of the automatic output audio volume adjuster in response to detecting the presence of the at least one other user in the media presentation environment, wherein the adjusting of the output audio volume level to the first output audio volume level when the user is proximate to the first location is not performed, and wherein the adjusting of the output audio volume level to the second output audio volume level when the user is proximate to the second location is not performed.

10. A method for adjusting output audio volume level of presented audio content that is output as sound from at least one speaker in a media presentation environment, the method comprising:
calibrating an automatic output audio volume adjuster, the calibrating comprising:
identifying a first location of a user in the media presentation environment;
associating a first output audio volume level of the sound output from the at least one speaker with the first location;
identifying a second location of the user in the media presentation environment;
associating a second output audio volume level of the sound output from the at least one speaker with the second location;
storing information defining the first location and the associated first output audio volume level; and
storing information defining the second location and the associated second output audio volume level,
wherein after calibration of the automatic output audio volume adjuster, the method further comprising:
detecting a current location of the user listening to presented audio content;
adjusting the output audio volume level to the first output audio volume level when the user is proximate to the first location;
adjusting the output audio volume level to the second output audio volume level when the user is proximate to the second location;
determining a ratio between the first output audio volume level and a predefined normalized output audio volume level, wherein the first output audio volume level is a current output audio volume level of the presented audio content that is output as sound from the at least one speaker;
detecting a movement of the user;
determining a distance of movement of the user based on the detected movement;
increasing the first output audio volume level to a third output audio volume level when the detected user movement is in a first direction that is farther away from a predefined location in the media presentation environment, wherein the increased third output audio volume level is equal to the determined distance of the user movement multiplied by a predefined output audio volume level function, and further multiplied by the determined ratio; and
decreasing the first output audio volume level to the third output audio volume level when the detected user movement is in a second direction that is closer to the predefined location in the media presentation environment, wherein the decreased third output audio volume level is equal to the determined distance of user movement multiplied by the predefined output audio volume level function, and further multiplied by the determined ratio.

11. A media device, comprising:
a media content stream interface configured to receive streaming media content, wherein the streaming media content comprises at least audio content that;
a presentation device interface configured to output the audio content to a media presentation device that controls audio output from at least one speaker, wherein the audio content is output as sound from the at least one speaker into a media presentation environment;
a memory that stores audio control logic; and
a processor system communicatively coupled to the presentation device interface, the memory and the media content stream interface,
wherein the processor system is configured to calibrate the audio control logic, the calibrating comprising:
identifying a first location of a user in the media presentation environment;
associating a first output audio volume level of the sound output from the at least one speaker with the first location;
identifying a second location of the user in the media presentation environment;
associating a second output audio volume level of the sound output from the at least one speaker with the second location;
storing information in the memory defining the first location and the associated first output audio volume level;
storing information in the memory defining the second location and the associated second output audio volume level;
defining an output audio volume level function based on the first output audio volume level and the associated first location, and based on the second output audio volume level and the associated second location; and
storing information defining the output audio volume level function,
wherein the processor system is configured to adjust output audio volume after the calibration of the audio control logic, the adjusting of the volume comprising:
determine a current location of the user listening to the presented audio content;
adjusting the output audio volume level to the first output audio volume level when the user is proximate to the first location;
adjusting the output audio volume level to the second output audio volume level when the user is proximate to the second location;
determining a third output audio volume level based on the current location of the user listening to presented audio content and based on the output audio volume level function; and
adjusting the output audio volume level to the third output audio volume level when the user is at the current location.

12. The media device of claim 11, further comprising:
a detector configured to detect a movement of the user from the first location to the second location in the media presentation environment,
wherein the processor determines the current location of the user based on information received from the detector.

13. The media device of claim 11, further comprising:
a detector configured to detect a movement of the user to a current location relative to the first location and the second location in the media presentation environment,
wherein the processor determines the current location of the user based on information received from the detector.

14. The media device of claim 11, further comprising:
an external detector interface configured to receive information from an external detector that detects a movement of the user from the first location to the second location in the media presentation environment, wherein the processor determines the current location of the user based on information received from the external detector.

15. The media device of claim 14, wherein the external detector resides in an infrared (IR) blaster that is external to the media device, and wherein the IR blaster further comprises:
an IR interface configured to transmit an infrared signal comprising information that is used to determine the current location of the user.

16. The media device of claim 11, further comprising:
a remote interface configured to receive information from a remote control being operated by the user listening to the presented audio content,
wherein the remote interface receives a first user specification of a first desired output audio volume level, wherein the first user specification corresponds to a first volume level heard by the user when the user is at the first location, and wherein the first output audio volume level is defined based on the first user specification; and
wherein the remote interface receives a second user specification of a second desired output audio volume level, wherein the second user specification corresponds to a second volume level heard by the user when the user is at the second location, and wherein the second output audio volume level is defined based on the second user specification.

17. The media device of claim 11,
wherein the output audio volume level function is a first output audio volume level function,
wherein the first output audio volume level function is associated with a first type of media content,
wherein the calibrating by the processor system further comprises:
associating a fourth output audio volume level of the sound output from the at least one speaker with the first location;
associating a fifth output audio volume level of the sound output from the at least one speaker with the first location;
storing information in the memory defining the first location and the associated fourth output audio volume level; and
storing information in the memory defining the second location and the associated fifth output audio volume level,
wherein a second output audio volume level function is defined by the processor system based on the fourth output audio volume level and the associated first location, and based on the fifth output audio volume level and the associated second location,
wherein the second output audio volume level function is associated with a second type of media content that is different from the first type of media content,
wherein the first output audio volume level function produces a louder volume than the second output audio volume level function at the current location of the user listening to presented audio content,
wherein the first output audio volume level function is used when the currently presented media content event corresponds to the first type of media content, and
wherein the second output audio volume level function is used when the currently presented media content event corresponds to the second type of media content.

18. The media device of claim 11, wherein after calibration, the processor system if further configured to:
determine a presence of at least one other user in the media presentation environment; and
deactivate operation of the audio control logic in response to detecting the presence of the at least one other user in the media presentation environment,
wherein the adjusting of the output audio volume level to the first output audio volume level when the user is proximate to the first location in not performed, and
wherein the adjusting of the output audio volume level to the second output audio volume level when the user is proximate to the second location in not performed.

* * * * *